United States Patent
Zhang et al.

(10) Patent No.: US 6,801,880 B2
(45) Date of Patent: Oct. 5, 2004

(54) SYSTEM AND METHOD FOR MINIMIZING A LOADING EFFECT OF A VIA BY TUNING A CUTOUT RATIO

(75) Inventors: Lan Zhang, Austin, TX (US); Abeye Teshome, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/187,927

(22) Filed: Jul. 2, 2002

(65) Prior Publication Data

US 2004/0003942 A1 Jan. 8, 2004

(51) Int. Cl.[7] ............................. G06F 17/50; H05K 7/06
(52) U.S. Cl. ................................... 703/1; 29/593
(58) Field of Search ........................ 703/1–4, 13–14; 324/158.1; 29/592.1, 593, 829; 438/17–18, 618–619, 637–640; 174/262, 263, 264, 266, 254, 255; 361/792, 795

(56) References Cited

U.S. PATENT DOCUMENTS

| | | |
|---|---|---|
| 3,859,711 A | 1/1975 | McKiddy |
| 4,285,780 A | 8/1981 | Schachter |
| 5,450,290 A | 9/1995 | Boyko et al. |
| 5,459,287 A | 10/1995 | Swamy |
| 5,477,082 A | 12/1995 | Buckley, III et al. |
| 5,530,288 A | 6/1996 | Stone |
| 5,558,928 A | 9/1996 | Distefano et al. |
| 5,585,162 A | 12/1996 | Schueller |
| 5,706,178 A | 1/1998 | Barrow |
| 5,784,262 A | 7/1998 | Sherman |
| 5,796,589 A | 8/1998 | Barrow |
| 5,812,379 A | 9/1998 | Barrow |
| 5,841,074 A * | 11/1998 | Egan et al. .................. 174/250 |
| 5,875,102 A | 2/1999 | Barrow |
| 5,972,734 A | 10/1999 | Carichner et al. |
| 6,050,832 A | 4/2000 | Lee et al. |
| 6,137,709 A | 10/2000 | Boaz et al. |
| 6,144,576 A | 11/2000 | Leddige et al. |
| 6,201,194 B1 | 3/2001 | Lauffer et al. |
| 6,233,820 B1 * | 5/2001 | Hummelink ................. 29/847 |
| 6,362,973 B1 * | 3/2002 | Leddige et al. ............. 361/762 |
| 6,366,466 B1 * | 4/2002 | Leddige et al. ............. 361/760 |
| 6,373,139 B1 | 4/2002 | Clark |
| 6,395,378 B2 * | 5/2002 | Bergstedt et al. ........... 428/209 |
| 6,486,414 B2 * | 11/2002 | Kobayashi et al. ......... 174/261 |

FOREIGN PATENT DOCUMENTS

| | | | |
|---|---|---|---|
| JP | 40294693 A | * | 4/1990 |
| JP | 06037416 A | * | 2/1994 |

* cited by examiner

*Primary Examiner*—Evan Pert
(74) *Attorney, Agent, or Firm*—Haynes and Boone, LLP

(57) ABSTRACT

An information handling system that includes a circuit board for mounting and coupling components of the information handling system. The circuit board includes a trace, a via coupled to the trace, and a cutout region surrounding the via and having a first diameter selected to minimize a loading effect of a via on a signal conveyed on the trace.

6 Claims, 2 Drawing Sheets

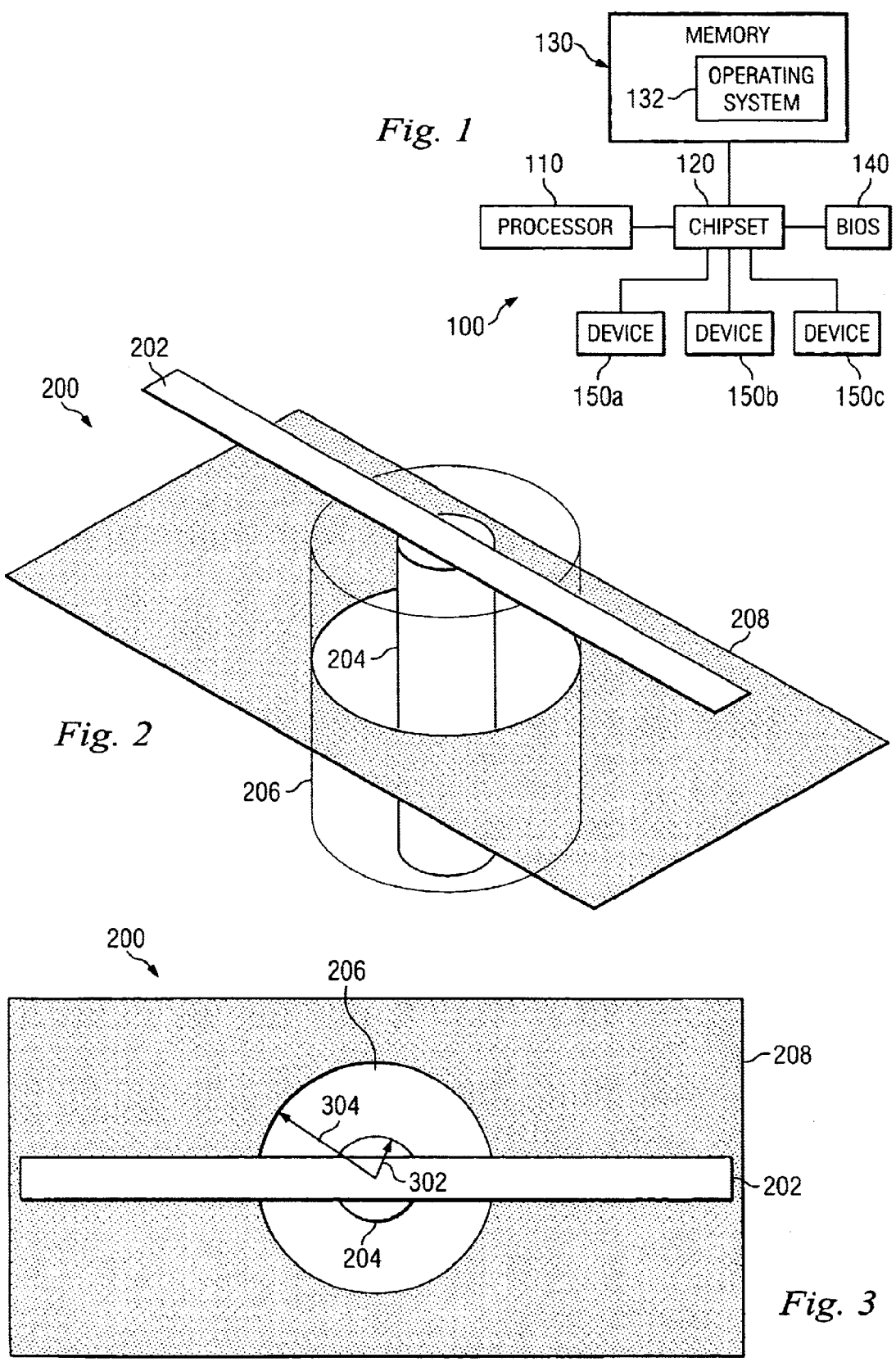

SYSTEM AND METHOD FOR MINIMIZING A LOADING EFFECT OF A VIA BY TUNING A CUTOUT RATIO

BACKGROUND

The disclosures herein relate generally to information handling systems and more particularly to a system and method for minimizing a loading effect of a via by tuning a cutout ratio.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are often manufactured using a circuit board that mounts and couples numerous components. The circuit board typically includes a plurality of power and signal layers that are used to convey power and signals between the components of the system. The power and signal layers are sandwiched between insulation layers to prevent current transfer between the layers. The layers include signal paths known as traces. To route a signal between layers of the board, a via connects traces between the different layers. Unfortunately, the use of vias present loading effects on signals that may cause impedance and other electrical parameter discontinuities along the traces. As a result, signal integrity may be affected, particularly at high signal speeds.

It would be desirable to be able to minimize the loading effects of a via on a circuit board. Accordingly, what is needed is a system and method for minimizing a loading effect of a via by tuning a cutout ratio.

SUMMARY

One embodiment, accordingly, provides an information handling system that includes a circuit board for mounting and coupling components of the information handling system. The circuit board includes a trace, a via coupled to the trace, and a cutout region surrounding the via and having a first diameter selected to minimize a loading effect of a via on a signal conveyed on the trace.

A principal advantage of this embodiment is that various shortcomings of previous techniques are overcome. For example, a loading effect of a via on a circuit board may be minimized.

BRIEF DESCRIPTION OF THE DRAWINGS

FIG. 1 is a diagram illustrating an embodiment of selected portions of an information handling system.

FIG. 2 is a first diagram illustrating an embodiment of portions of a circuit board for minimizing a load effect of a via by tuning a cutout ratio.

FIG. 3 is a second diagram illustrating an embodiment of portions of a circuit board for minimizing a load effect of a via by tuning a cutout ratio.

DETAILED DESCRIPTION

Figure 4:
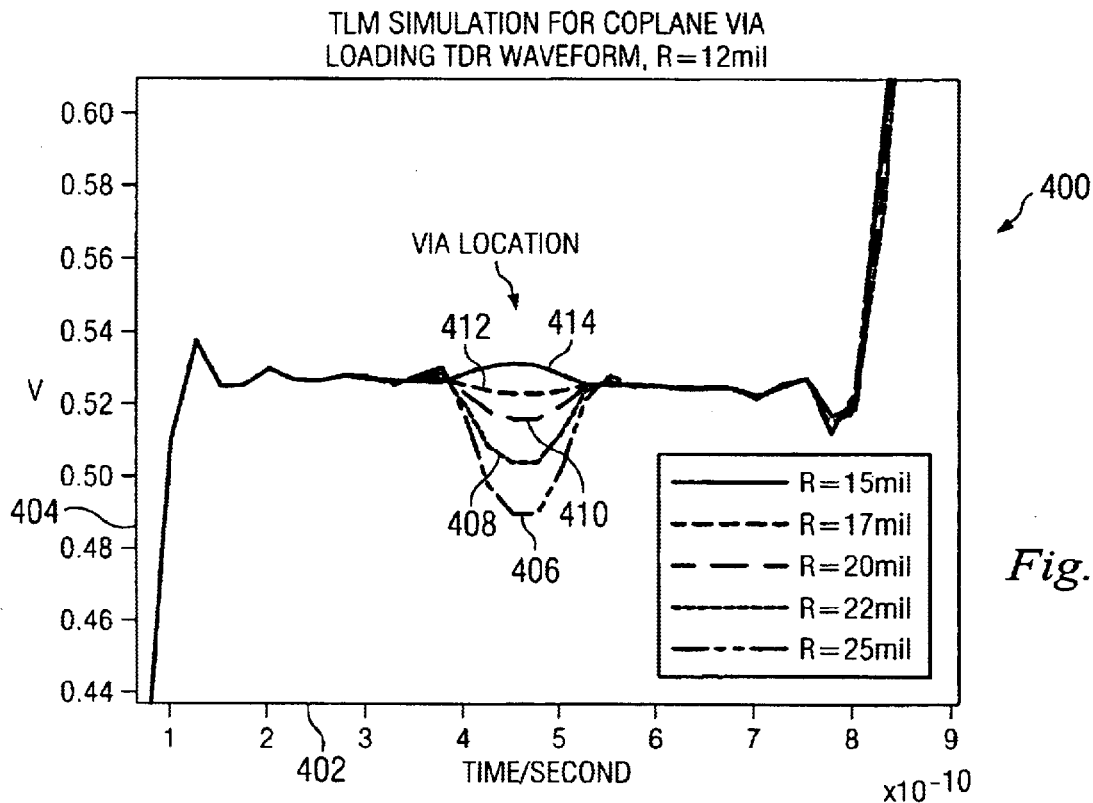
FIG. 4 is a diagram illustrating an example of a loading effect of a via for various cutout diameters.

For purposes of these embodiments, an information handling system may include any instrumentality or aggregate of instrumentalities primarily designed to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a diagram illustrating an embodiment of selected portions of an information handling system 100. Information handling system 100 is an instrumentality or aggregate of instrumentalities primarily designed to compute, classify, process, transmit, receive, retrieve, originate, switch, store, display, manifest, detect, record, reproduce, handle, or utilize any form of information, intelligence or data for business, scientific, control or other purposes. System 100 includes a processor 110, a chipset 120, a memory 130, a basic input output system (BIOS) 140, and devices 150*a*, 150*b*, and 150*c*. Chipset 120 is coupled to processor 110, memory 130, BIOS 140, and devices 150*a*, 150*b*, and 150*c*. Memory 130 includes an operating system 132 and may include multiple types of storage media such as RAM, DRAM, SDRAM, one or more hard disk drive, and other storage devices. Devices 150*a*, 150*b*, and 150*c* are each connected to chipset 120 using a bus such as a PCI or Universal Serial bus, a direct connection to a device controller within chipset 120, or other suitable connection means.

System 100 operates by executing BIOS 140 or a system firmware (not shown) in response to being powered up or reset. BIOS 140 identifies and initializes the components of system 100 and causes operating system 132 to be booted. Operating system 132 provides a user of system 100 with an ability to initiate and run one or more applications (not shown) on system 100. The applications may be stored on a storage media of system 100 or on a remote device configured to communicate with system 100. System 100 may be configured to communicate with other devices or information handling systems using wired or wireless communications devices.

FIGS. 2 and 3 are diagrams illustrating an embodiment of portions of a circuit board 200 for minimizing a load effect by tuning a cutout ratio. FIG. 2 illustrates an expanded side view of circuit board 200, and FIG. 3 illustrates a top view of circuit board 200. Circuit board 200 includes a trace 202 coupled to a via 204. Via 204 passes through a cutout region 206 and a planar layer 208. Planar layer 208 is disposed parallel to a length of trace 202 and perpendicular to a length of via 204 and a length of cutout region 206. Circuit board 200 is for mounting and coupling components of information handling system 100. Trace 202 conveys one or more signals in system 100 such as a bus signal. The signals conveyed on trace 202 may be relatively high frequency signals for an information handling system.

Via 204 is a cylindrical structure that has a circular cross section, and cutout region 206 defines a cylindrical shape that surrounds via 204. As shown in FIG. 3, the cross section of via 204 has a diameter as indicated by an arrow 302, and cutout region 206 has a diameter as indicated by an arrow 304. As used in the description herein, the term "via diameter" refers to the diameter indicated by arrow 302, and the term "cutout diameter" refers to the diameter indicated by arrow 304. In addition, the term "cutout ratio" refers to the ratio of the cutout diameter to the via diameter.

The via diameter and/or the cutout diameter, and hence the cutout ratio, are selected to minimize a loading effect of via 204 on a signal conveyed on trace 202. The term loading effect refers to signal discontinuities and other undesired signal behavior caused by the impedance properties, whether capacitive or inductive, associated with via 204. In particular, if via 204 is inductive, then the cutout ratio is decreased to minimize or cancel the parasitic inductive. Similarly, if via 204 is capacitive, then the cutout ratio is increased to minimize or cancel the parasitic capacitance. Accordingly, the cutout ratio is selected to minimize a loading effect of via 204 on a signal conveyed on trace 202.

FIG. 4 is a diagram illustrating an example of a loading effect of via 204 for various cutout diameters of cutout region 206. In FIG. 4, frequency is plotted along an x-axis 402 and voltage is plotted along an y-axis 404. Five different plots 406, 408, 410, 412, and 414 are shown for five different diameters of cutout region 206, respectively, with a constant via diameter (24 mil, i.e. two times a radius of 12 mil). Plot 406 is associated with a cutout diameter of 30 mil, i.e. two times a radius of 15 mil. Plot 408 is associated with a cutout diameter of 34 mil, i.e. two times a radius of 17 mil. Plot 410 is associated with a cutout diameter of 40 mil, i.e. two times a radius of 20 mil. Plot 412 is associated with a cutout diameter of 44 mil, i.e. two times a radius of 22 mil. Plot 414 is associated with a cutout diameter of 50 mil, i.e. two times a radius of 25 mil.

As shown in FIG. 4, plot 412 with a cutout diameter of 44 mil appears to minimize the loading effect of via 204 as each of the other plots 406, 408, 410, and 414 show a greater amount of distortion over the frequency range. Accordingly, the cutout diameter of 44 may be selected along with the via diameter 12 to create a cutout ratio of 3.67 and minimize the loading effect of via 204.

In FIG. 4, the cutout diameter is selected in relation to a constant via diameter to minimize the loading effect of via 204 on the signal conveyed on trace 202. In other simulations, the via diameter may be selected in relation to a constant cutout diameter to minimize the loading effect of via 204 on the signal conveyed on trace 202. The selection of the values for the via diameter and the cutout diameter determines the cutout ratio. By selecting cutout and via diameters, the cutout ratio is tuned to minimize the loading effect of via 204.

Although the plots 406, 408, 410, 412, and 414 are relatively similar over much of the frequency range shown in FIG. 4, plots in other cases may diverge over other frequency ranges such that the cutout and/or via diameters are selected to minimize the loading effect of a via for a particular frequency range.

Figure 5:
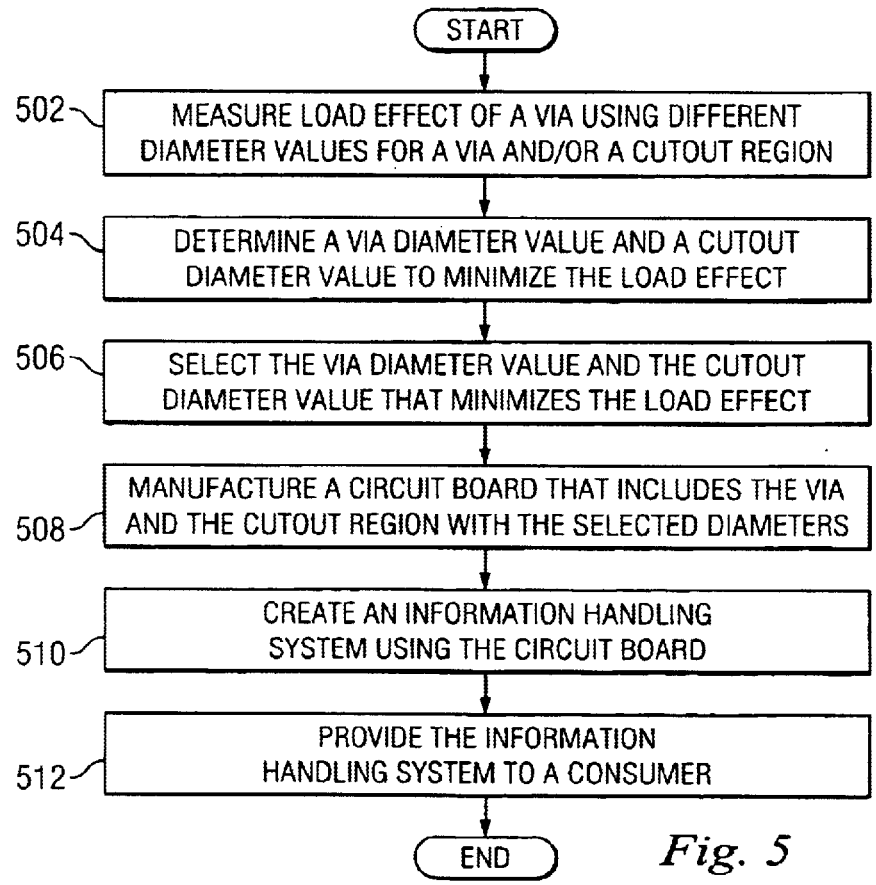
FIG. 5 is a flow chart illustrating an embodiment of a method for minimizing a load effect of a via by tuning a cutout ratio.

FIG. 5 is a flow chart illustrating an embodiment of a method for minimizing a load effect of a via by tuning a cutout ratio. FIG. 5 will be discussed with reference to circuit board 200 shown in FIGS. 2 and 3.

In FIG. 5, a load effect of via 204 using different diameter values for via 204 and/or cutout region 206 is measured as indicated in a step 502. The load effect may be measured using computer simulation of via 204 and cutout 206. A via diameter value and a cutout diameter value to minimize the load effect is determined as indicated in a step 504. The values may be determined from the results of a computer simulation. The via diameter value and the cutout diameter value that minimizes the load effect is selected as indicated in a step 506. Circuit board 200 that includes via 204 and cutout region 206 with the selected diameters is manufactured as indicated in a step 508. Information handling system 100 is created using circuit board 200 as indicated in a step 510, and information handling system 100 is provided to a consumer as indicated in a step 512.

As can be seen, the principal advantages of these embodiments are that various shortcomings of previous techniques are overcome. For example, a loading effect of a via on a circuit board may be minimized.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A method comprising:

receiving a circuit board having a trace, a cutout region, and a via coupled to the trace an passing through the cutout region and a planar layer of the board, the cutout region surrounding the via;

providing the via with a first constant diameter;

providing the cutout region with a second diameter, greater than the first diameter, whereby a cutout ratio is provide by the ratio of the second diameter to the first diameter; and varying the second diameter whereby, in response to the via being inductive, the cutout ratio is decreased, and in response to the via being capacitive, the cutout ratio is increased; and creating an information handling system using the circuit board.

2. The method of claim 1, wherein the via includes a substantially circular cross-section.

3. The method of claim 1, wherein the cutout region defines a substantially cylindrical region.

4. The method of claim 1, wherein the planar layer is disposed parallel to a length of the trace.

5. The method of claim 4, wherein the planar layer is disposed perpendicular to a length of the via an a length of the cutout region.

6. The method of claim 1, further comprising:

providing the information handling system to a consumer.

* * * * *

UNITED STATES PATENT AND TRADEMARK OFFICE
CERTIFICATE OF CORRECTION

PATENT NO. : 6,801,880 B2
DATED : October 5, 2004
INVENTOR(S) : Zhang et al.

It is certified that error appears in the above-identified patent and that said Letters Patent is hereby corrected as shown below:

<u>Column 4,</u>
Line 46, delete "provide" and insert -- provided --
Line 47, delete "and"

Signed and Sealed this

Third Day of May, 2005

JON W. DUDAS
*Director of the United States Patent and Trademark Office*